United States Patent [19]

Flink et al.

[11] 4,093,989

[45] June 6, 1978

[54] SPECTRUM ANALYZER USING DIGITAL FILTERS

[75] Inventors: Joseph H. Flink, Monsey; John Bertrand, Valley Cottage, both of N.Y.

[73] Assignee: Rockland Systems Corporation, West Nyack, N.Y.

[21] Appl. No.: 747,053

[22] Filed: Dec. 3, 1976

[51] Int. Cl.² ..................... G06F 15/34; G01R 23/16
[52] U.S. Cl. .................... 364/485; 324/77 B; 364/572; 364/602; 364/724
[58] Field of Search ............. 235/156, 152, 150.5, 235/151.31; 328/167; 333/18, 28, 70 T; 325/42; 324/77 B, 77 D, 77 E

[56] References Cited

U.S. PATENT DOCUMENTS

| | | | |
|---|---|---|---|
| 3,586,843 | 6/1971 | Sloane | 235/156 |
| 3,633,105 | 4/1972 | Lender et al. | 333/18 X |
| 3,816,729 | 6/1974 | Works | 235/156 |
| 3,879,661 | 4/1975 | Collins | 324/77 B |
| 3,881,097 | 4/1975 | Lehmann et al. | 235/156 |
| 3,935,437 | 1/1976 | Schmitt et al. | 324/77 B X |

Primary Examiner—Joseph F. Ruggiero
Attorney, Agent, or Firm—Flynn & Frishauf

[57] ABSTRACT

A spectrum analyzer using digital filters for providing third octave spectrum analysis comprises means for breaking up input information into a plurality of digital data blocks, each block being of a given time duration and being within respective frequency ranges, means for weighting the information contained in the data blocks and means for digitally filtering the weighted digital data blocks with digital filtering devices having at least one center frequency falling within the frequency range represented by each of the data blocks, each of the data blocks comprising N samples satisfying the following equation- $$N > K f_o / B_n$$

where $K$ is a constant which is a function of the sampling rate and the falloff rate of the skirt of filter characteristic, $B_n$ is the filter bandwidth and $f_o$ is the center frequency of the filter.

18 Claims, 13 Drawing Figures

INPUT OF LPF EXAMPLE: (ANALYSIS RANGE 20KHz SINEWAVE FREQUENCY OF 16KHz)

OUTPUT OF LPF

SPECTRUM ANALYZER USING DIGITAL FILTERS

Cross References, the entire contents of which are incorporated herein by reference 1. L. R. Rabiner and Gold, B, "Theory of Digital Signal Processing", pages 384–388, Prentice-Hall, Inc., Englewood Cliffs, N.J. 1975.
2. ANSI Recommendation, Publication SI.II-1966, "American Standard Specification for Octave, Half-Octave and Third-Octave Band Filter Sets", page 7
3. IEC Recommendation, Publication 225, "Octave, Half-Octave and Third-Octave Band Pass Filters Intended for the Analysis of Sounds and Vibration," 1966.
4. ANSI Recommendation, Publication SI.II-1966, "American Standard Specification for Octave, Half-Octave and Third-Octave Band Filter Sets".
5. DIN Recommendation, Publication 45 652, "Terzfilter Fur Electroakustische Messungen".
6. B+K Instruments, Inc., "Master Catalog 1974", 325-328.
7. General Radio Catalog 1973, 64 – 66.
8. A. V. Oppenheim and Schaefer, R. W., "Digital Signal Processing", 26–30, Prentice-Hall, Inc., Englewood Cliffs, N.J., 1975.
9. Kharhevich, A. A., "Spectra and Analysis", 115–124, Consultants Bureau, New York 1960. Translated from Russian
10. Reference 9, page 123, FIG. 38
11. Reference 9, page 120, FIG. 37
12. G. C. Maling, Jr. et al, "Digital Determination of Third-Octave and Full-Octave Spectra of Acoustical Noise", IEEE Trans. on Audio and Electro., June 1967, pp 98–104.
13. Reference 8, chapter 6
14. Reference 8, page 28
15. L. R. Rabiner and Gold, B., "Theory of Digital Signal Processing", Chapter II, Prentice-Hall, Inc., Englewood Cliffs, N.J., 1975.
16. Reference 8.
17. J. S. Bendat and Prersol, A. G., "Random Data: Analysis and Measurement Procedures" pp 314–320, Wiley — Interscience New York, 1971.
18. Gersch, Will, "The Effects of Time Weighting the Input to a Spectrum Analyzer" IRE Trans on Circuit Theory, June 1961 pp 121-126.
19. Burgess, John C., "On Digital Spectrum Analysis of Periodic Signals" J. Acoust. Soc. of Am., Vol 58, No. 3, Sept 1975 pp 556-567.
20. Microprogram Sequencers, The Am 2909 and Am 2911, Advanced Micro Devices, Inc., Sunnyvale, Calif.

This invention relates to spectrum analyzers, and more particularly, to spectrum analyzers using digital filters.

Spectrum analysis decomposes a signal into the energy, power or square root of power present at each frequency (sinusoidal). Techniques for performing the analysis include using filters or equivalent algorithms. Two types of filters are commonly used. They are referred to as constant bandwidth and proportional bandwidth filters. In constant bandwidth analyses, the filters used are equally spaced over the analysis range and have a fixed bandwidth. In proportional bandwidth analyses, the bandwidth of filters is proportional to their center frequency. The Fourier transform is an example of a constant bandwidth analysis[1], while third- and one-octave analysis are examples of a proportional bandwidth one[2].

Figure 1:
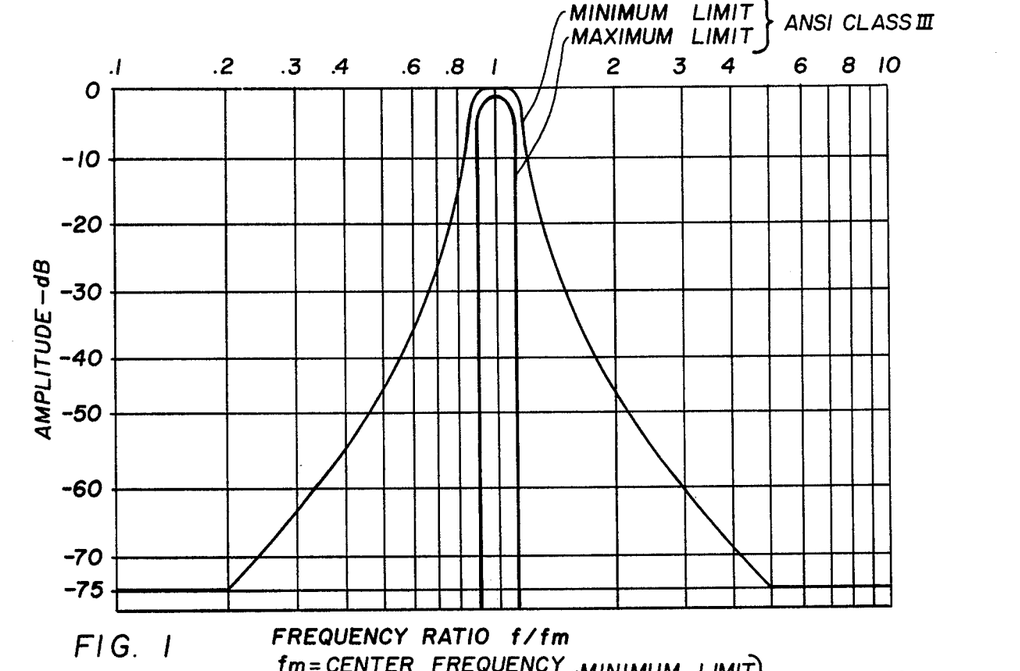
FIG. 1 illustrates the skirt selectivity of a filter.

The filters employed in third-octave and one-octave analysis must conform to specifications set in accordance with IEC 225-1966[3], ANSI SI.II-1966[4] and DIN 45 652A[5]. These specifications define the filters' center frequencies, bandpass characteristic and the maximum and minimum skirt selectivity. For example, in reference 4, a Class III Type E set of ⅓-octave filters corresponds to 30 contiguous filters centered from 25 Hz to 20,000 Hz whose skirt selectivity falls between the maximum and minimum indicated in FIG. 1.

Measurement of proportional bandwidth spectrum can be accomplished by using either analog filters or digital filters, as described below.

Available commercial instruments generally use a bank of analog filters, each filter designed to meet one or all of the above specifications [6,7]. Functionally, the output of each filter is squared, integrated and the averaged power displayed on a meter and/or a graphic device.

An alternate approach is to convert the input analog data into digital format and perform the analysis using a processor which will do digital filtering, squaring, integrating and then convert the results back to an analog format. The results can be made identical to the results obtained with analog filters, as long as the processor is capable of very high speed, i.e., can process all the input samples collected, and the input analog data are sampled at a rate which exceeds twice the highest frequency to be analyzed[8].

If the processor is not capable of the required high speed operation, then a long block of data can be collected, stored and then processed. However, the long block of data requires a large amount of storage to be provided. If the block length is not long enough, then the filter's selectivity will not realize its steady-state characteristic [9]. For short blocks, its apparent bandwidth is wider [10] and its skirt selectivity is less steep [11].

If the block length is chosen in order to provide good skirt selectivity, then the block length will be excessively large and a large amount of storage will be required. This is disadvantageous from a hardware and speed of operation point of view. Therefore, in the present invention the block length (that is, the number of samples in a block) is determined by bandwidth and center frequency requirements. The skirt selectivity is improved according to the present invention by utilizing a weighting function and multiplying the data in a data block by the weighting function.

Widening of the bandwidth can be avoided if the block length is long enough to permit the narrowest filter to charge close to its steady-state value. If $B_n$ is the bandwidth of the narrowest filter, then the block length T must be at least three times constants, i.e., $$T > 3/B_n \tag{1}$$

The sampling frequency is determined by the widest filter, which also is the highest-centered filter. Combining these facts with the third-octave specifications requires that the number of data samples $N$ must satisfy $$N > K(f_o/B_n) \tag{2}$$

where a typical value of $K$ is 6.7 and $f_o$ is the center frequency of the highest filter. For example, an ANSI Class III, type E bank filter requires that $N > 23,304$ digital samples; each will typically be 10–12 bits.

Figure 2:
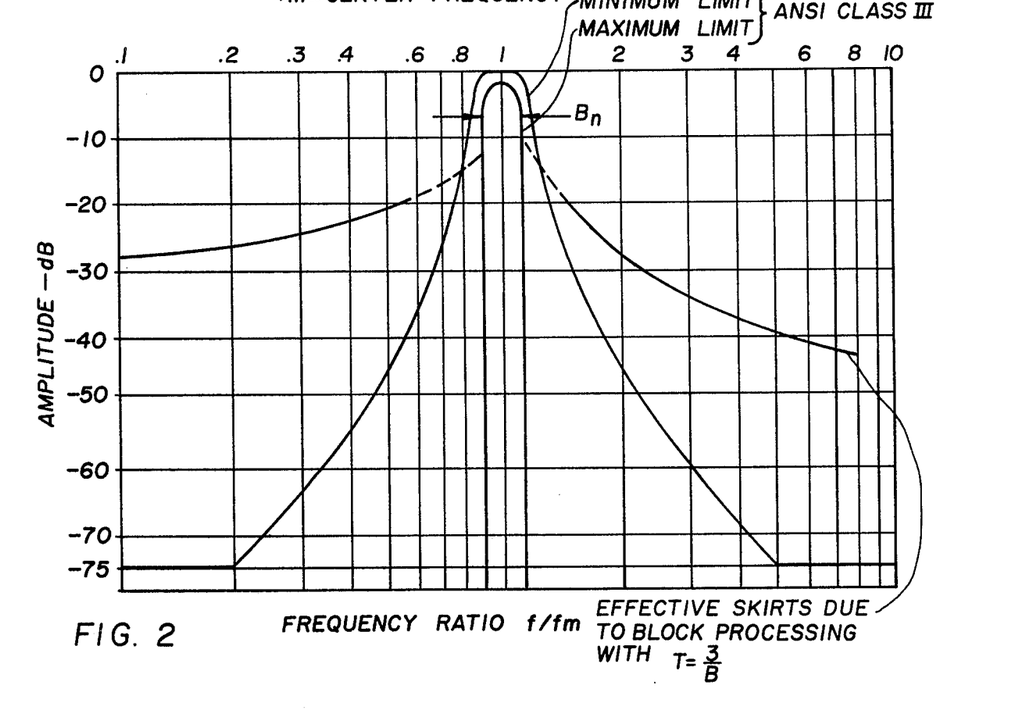
FIG. 2 is a graph illustrating the effect of block processing on skirt selectivity.

Using a block length indicated above in formula (1), while adequate to achieve desired bandwidth, $B_n$, is not sufficient to avoid degrading the filter's skirt selectivity. For $T = 3/B_n$ the apparent skirt selectivity for a filter, whose steady state response corresponds to the "maximum" limit is indicated in FIG. 2. If the block length is increased significantly, then skirt degradation will not occur. However, a block length at least 6000 times longer is required. This is unwieldy and results in an undesirable system.

Another known technique is based on constant bandwidth analysis. It involves adding the power from adjacent narrow band filter outputs [12]. The number of adjacent filters depends on the corresponding third octave filter. Unfortunately, the inherent noise of the constant bandwidth analyzer gets added, thereby reducing the dynamic range of the analysis. For example, using a constant bandwidth analyzer, equivalent to 400 contiguous filters, will reduce the dynamic range for a sine wave in the 16 KHz centered filter by 19 dB. The effect will be to limit the dynamic range to between 40 and 50 dB for present processors and their associated low pass filter and analog-to-digital converter.

It is an object of the present invention to provide a spectrum analyzer using digital techniques which overcomes the disadvantages of the prior art techniques.

More particularly, it is an object of the present invention to provide a digital spectrum analyzer which utilizes a minimum of hardware, which is operable at high speeds, and which has high skirt selectivity and dynamic range.

SUMMARY OF THE INVENTION

In accordance with the present invention, a spectrum analyzer comprises a source of an input signal having a frequency characteristic; means responsive to said input signal for providing a plurality of digital input information data blocks, each data block of a given time duration and each data block comprising a predetermined number of digital words, each data block representing signal energy within a given different frequency range; means coupled to said data block source for weighting respective ones of the digital words as a function of a weighting function having a "smooth" function at its end points corresponding to the end points of the data block; and means for digitally filtering each of the weighted digital data blocks with digital filtering means having at least one center frequency falling within the frequency range represented by each of the data blocks, each of the data blocks comprising N samples satisfying the following equation:

$$N > (Kf_o/B_n)$$

where $K$ is a constant which is a function of the sampling rate and the falloff rate of the skirt of the filter characteristic, $B_n$ is the filter bandwidth and $f_o$ is the center frequency.

In a preferred embodiment, the means for converting the input signal into a plurality of digital input information blocks includes an analog low pass filter with a controlled low pass cutoff, an A/D converter operative at a controlled sampling rate and control means for setting the sampling rate and the low pass cutoff of the low pass filter.

DETAILED DESCRIPTION

Figure 3:
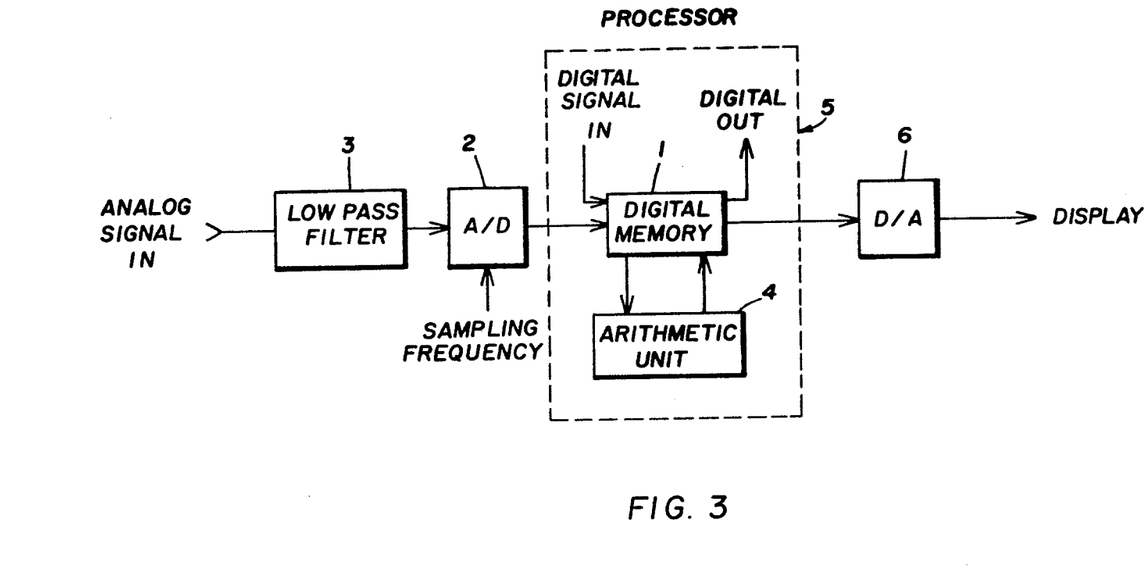
FIG. 3 is a functional block diagram of a basic constant bandwidth and proportional bandwidth spectrum analyzer.

FIG. 3 is a basic block circuit diagram of a constant bandwidth spectrum analyzer illustrating the basic technique of the present invention. The instrument is capable of high speed processing using the Fast Fourier Transform[13], which is an efficient algorithm for implementing the Fourier Transform.

In the system of FIG. 3, digital data is directly applied to the digital memory 1 while analog data must first be converted to digital format using an A/D converter 2. A low pass filter 3, with sharp rolloff, precedes the A/D converter 2 to restrict the signal bandwidth to be less than half the sampling rate of the A/D converter to avoid aliasing errors [14]. A sampling frequency signal is applied to the A/D converter 2. The memory 1 is coupled to an arithmetic unit 4, which together comprise a processor 5.

The sampling rate and cutoff of the low pass filter 3 track and maintain a fixed ratio. The output from the processor 5 is in digital format, or can be converted by a D/A converter 6 for analog display and/or analog recording.

The arithmetic unit 4 of the processor 5 comprises, for example, a high-speed multiplier, a high-speed scratchpad or buffer memory, a high-speed arithmetic logic unit for adding, shifting digital words left or right, and complementing, a look-up table of stored coefficients (ROM) and counters to keep track of the progress of calculations. The type of structure used is well known and will be further apparent from the descriptions hereinbelow. Similar structures have been described and heretofore implemented [15].

The type of calculation that must be performed for constant bandwidth analysis is described by the discrete Fourier transform. If one defines the spectral value at frequency elements, $k$, as $F(k)$ and, if $f(n)$ are N samples of the input function $(f(o), f(1) \ldots f(n-1))$ then $$F(k) = \sum_{n=0}^{n-1} f(n) \left[ \cos\left(\frac{2\pi nk}{N}\right) - j \sin\left(\frac{2\pi nk}{N}\right) \right] \quad (3)$$

$$k = 0, 1, 2, \ldots N - 1$$

The Fast Fourier transform applied to equation (3) reduces the number of operations by eliminating redundant calculations. The basic operations are multiplication of numbers stored in memory and coefficients (sin and cos) stored in a ROM (read only memory), adding the products and storing the results. The hardware requirements to implement this calculation are moderate: A 1-2 usec. multiplier and a 4096 word memory will produce the equivalent of 400 contiguous constant bandwidth filters capable of processing a new block of data in less than 200 msec. and preferably every 40-80 msec.

It is desirable to use the same spectrum analyzer to perform proportional bandwidth spectrum analysis. The building blocks are the same (FIG. 3) because the algorithm has the same form, i.e.

$$F(k) = \alpha_1 F(K-1) + \alpha_2 F(k-2) + \ldots$$
$$+ f(k) + \beta_1 f(k)-1) + \beta_2 f(k-2) + \ldots \quad (4)$$

where $F(k)$, $F(K-1)$ ... are the filter outputs $f(k)$, $f(k-1)$ ... are the filter inputs and $\alpha_1, \alpha_2 \ldots \beta_1, \beta_2 \ldots$ are stored coefficients.

Like the Fourier transform, table lookup, multiplication, addition and storage are performed. However, neither the storage nor the multiplier speed are sufficient to realize ANSI Class III third-octave analysis. The memory needed is at least six times larger and the speed of the multiplier is similarly faster.

Figure 4:
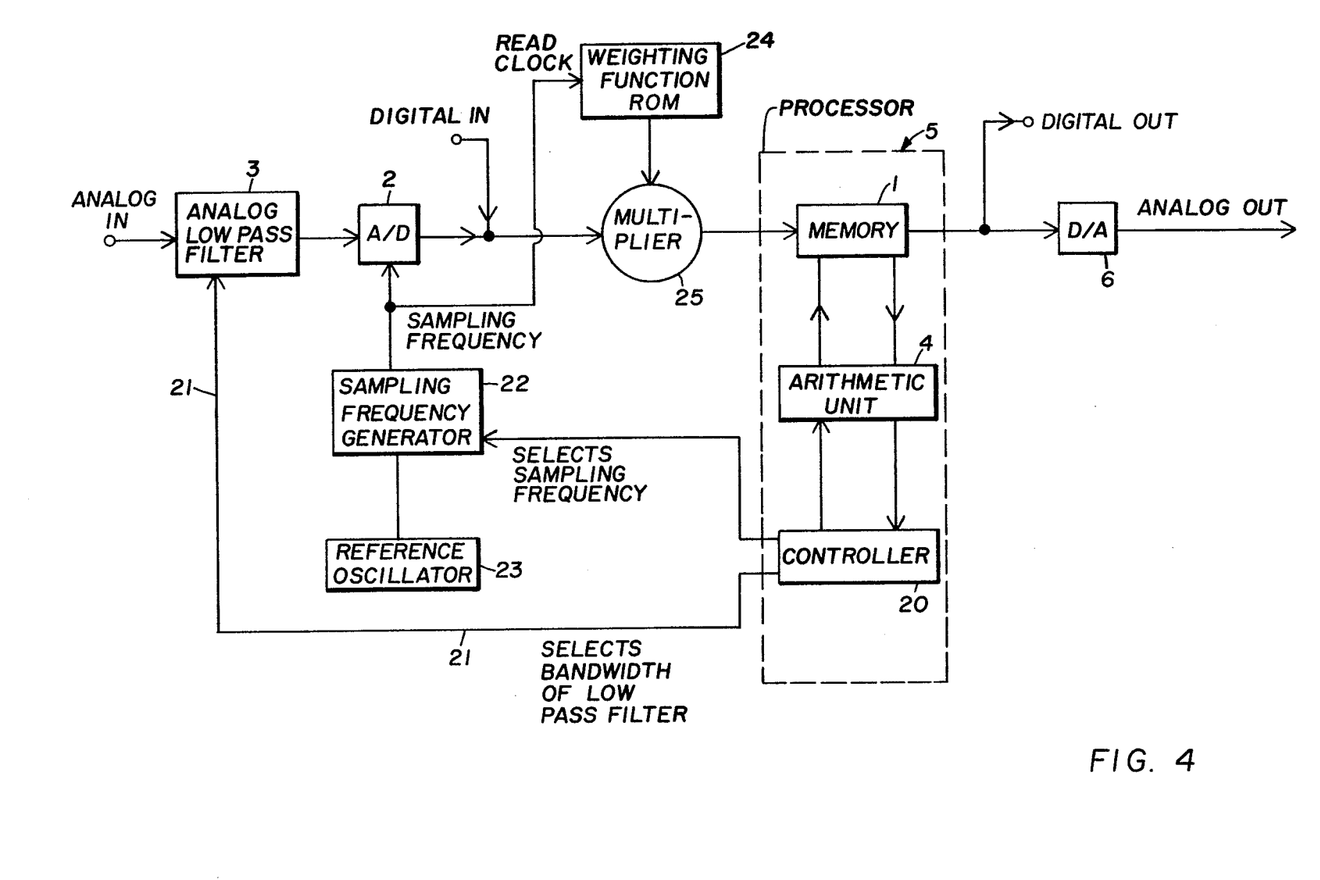
FIG. 4 is a functional block diagram, in greater detail, of a spectrum analyzer according to the present invention.
Figure 5:
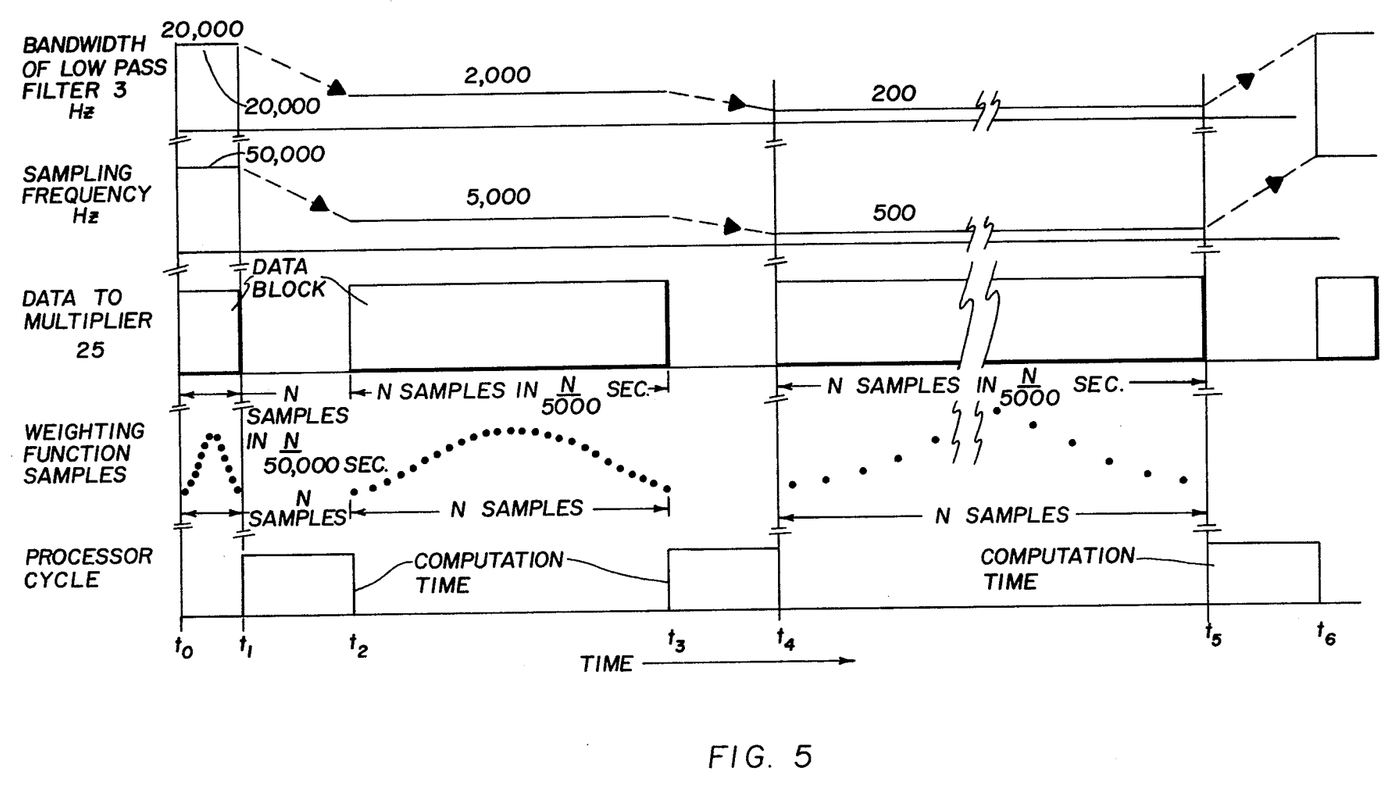
FIG. 5 illustrates time charts showing the timing sequence of operations in a spectrum analyzer according to FIG. 4.

The essence of the present invention resides in the implementation of the proportional bandwidth analysis so as to overcome limitations of multiplier speed and memory size. FIG. 4 is a functional block diagram, in greater detail, of a system according to the present invention. Its associated timing diagram is shown in FIG. 5.

The technique of the present invention comprises:
(a) automatically separating the analysis range into a number of ranges;
(b) collecting a short block of data for each analysis range;
(c) amplitude weighting each data block by multiplying by a weighting function; and
(d) processing each data block by digital filtering, squaring and integrating.

As an example, the analysis range is split into three ranges; 0-20,000 Hz, 0-2000 Hz and 0-200 Hz. This is accomplished by the processor's controller 20 automatically adjusting the cutoff of the LP filter 3 via the control line 21 and the sampling frequency applied to A/D converter 2.

For each analysis range in the illustrated embodiment, spectrum analysis for about 10 third-octave filters is performed. The combined analysis from the three analysis ranges yields a 30 third-octave filter set. In effect, the proportional bandwidth analysis is performed in a parallel-serial fashion. Referring to FIGS. 4 and 5, from time $t_o$ to $t_1$, data for the top 10 filters are collected (0-20,000 Hz range) and from $t_1$ to $t_2$ the data is processed. Then a new data block (0-2000 Hz) is collected ($t_2 - t_3$) and processed ($t_3 - t_4$) for the middle 10 filters. The data block collection is then performed in the 0-200 Hz range ($t_4 - t_5$) and processed ($t_5 - t_6$). The overall process is then repeated.

By dividing the analysis range into three ranges, the number of samples required for each range (equation (2)) is N >256, resulting in low storage requirements and equipment economy.

As each analysis range is changed, so is the sampling frequency which maintains a fixed ratio to the bandwidth of the analysis range. The ratio is determined by the aliasing error that is tolerable. For a LP filter 3 with infinite cutoff, the ratio is $2^{16}$. In the present implementation, the LP filter skirt has a rolloff of 120dB/octave. The criterion is to attenuate aliasing errors by 70dB, resulting in a ratio of sampling frequency to analysis range of 2.56. Thus, the controller 20 sends a signal to the sampling frequency generator 22 to cause it to generate the proper sampling frequency corresponding to the selected analysis range.

As each analysis range is changed by a factor of 10, so does the time to collect a data block since the number of samples are kept constant. This is seen from FIG. 5. However, as should be apparent, the process is applicable to different range changing factors and different data collecting times will accordingly result.

A weighting function, comprising a set of numbers, is stored in a memory 24 such as a ROM. The number of samples representing the weighting function is equal to the number of samples collected in each block. (It can also be equal to half or less than the number of samples in the case where the weighting function has points of symmetry). The effect of the weighting function is to contain the spectral energy of a short data block of a sine wave within the bandpass of the filter, thus preventing the skirt selectivity from degrading.

A typical weighting function is the Hanning [17] function. Other functions may be used. Their main property is that they must be smooth at each end, i.e., have many finite derivatives at each edge. If they are smooth the signal's spectrum decays very quickly for frequencies other than the sine wave's.

Prior art [18,19] recognized the utility of weighting. However, it was noted that the accuracy of analysis was degraded because one effect of the weighting was to cause the filter to have a different gain factor for white noise and for a sine wave. However, prior art considered the ratio of the peak output for a sine wave to the rms output for white noise which is not applicable to proportional bandwidth spectrum analysis where the ratio of the averaged sine-to-noise power is measured. Under the condition that the length of the data block is significantly greater than the reciprocal of the narrowest filter (equation (1) ), then the gain factor is identical for both types of signals.

Figure 6:
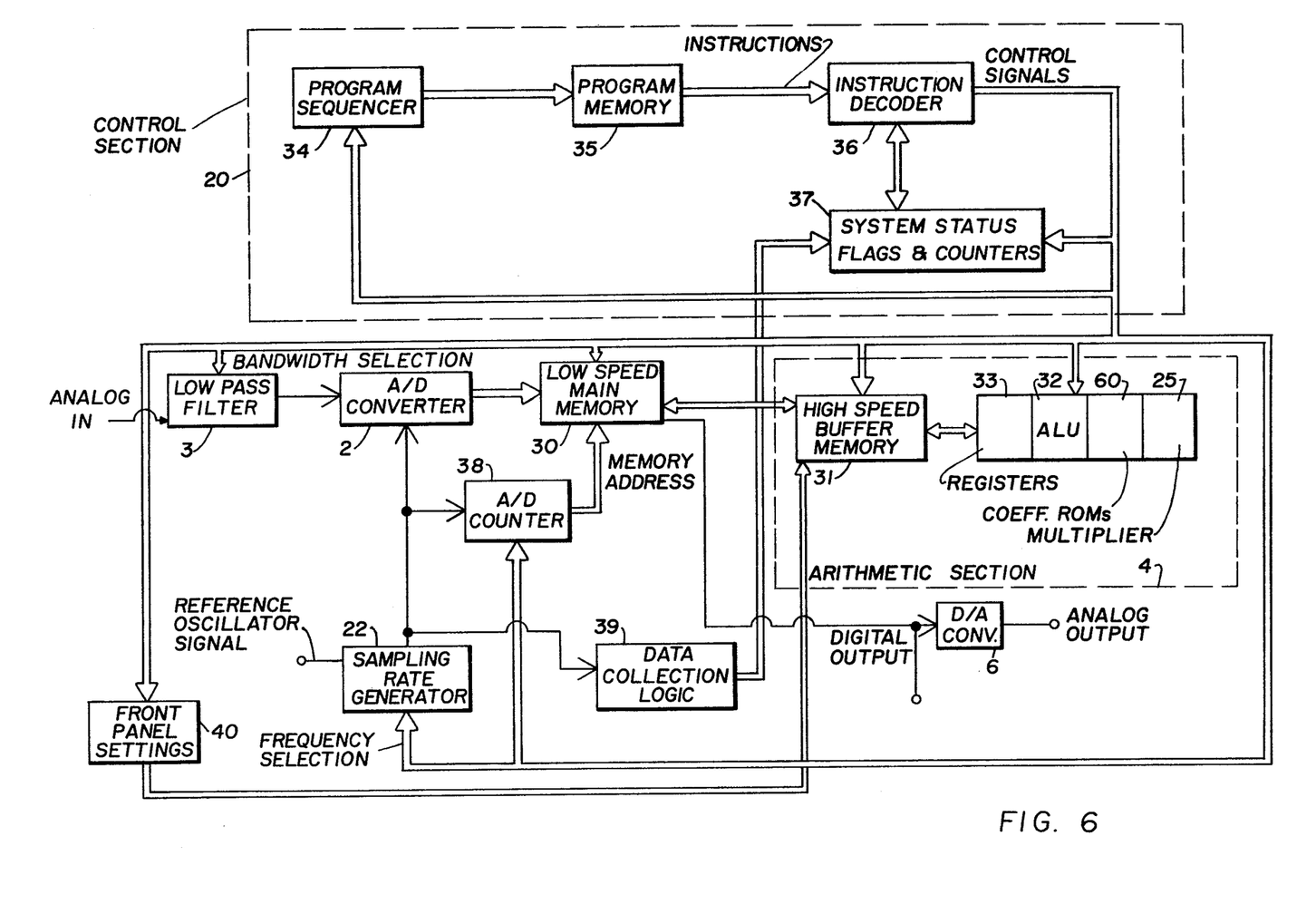
FIG. 6 is a block diagram of a practical implementation of the present invention.

FIG. 6 is a more detailed block diagram showing a practical implementation of the present invention in greater detail. Where possible, the same reference numerals as used in FIGS. 3 and 4 are used to designate common elements.

The block diagram of FIG. 6 is somewhat different from that of FIG. 4 and represents a practical manner of implementation of the arrangement of FIG. 4.

In FIG. 6, the output from the A/D converter 2 is fed to a low speed main memory 30, the output of which is fed to a high speed memory 31 in the arithmetic section 4. The low speed main memory is of relatively large capacity and the high speed buffer memory 31 is of small capacity and is used for performing operations on small portions of the data stored in the low speed memory 30. After a small portion of the contents of memory 30 is operated on, it is returned to the low speed main memory and another small portion is operated on. This is an efficient manner of operation since only a small high speed memory is required. The information from the high speed memory 31 is multiplied by a weighting function stored in the coefficient ROM 60 using the ALU section 32 and high speed multiplier 25 of the arithmetic unit 4. After the information is multiplied by the weighting function, it is returned to the low speed main memory 30 via the high speed memory 31 and registers 33.

The control section $20^{20}$ includes a program sequencer 34 which includes program counters to keep track of the operations going on in the system. The program sequencer 34 provides information addresses to a program memory 35 which stores the instructions which are sent to the instruction decoder 36 and then to the arithmetic section, low speed memory and low pass filter 3. The control section also includes a system status and flag counter device 37 which is also provided, as is conventional, to keep track of various operations going on in the system. Also provided in the system is an A/D counter 38 which is coupled to a data collection logic circuit 39. The data collection logic device 39 is also conventional and is provided to keep track of the data blocks and to keep track of where to locate them. The data collection logic 39 and the sampling rate generator 22 are both collected by the instruction outputs of the control section 20. The front panel 40 includes control switches, the most important of which is a bandwidth selection switch for selecting the range in which the system of the present invention will operate. By changing the sampling rate of the sampling rate generator, the system to the right of the A/D converter 2 "looks like" different digital filters having different bandpass frequencies. In digital filtering theory, digital filters have the property that their effective frequency response is a function of the sampling rate of the A/D converter. Thus, by changing the bandpass of the low pass filter 3 and the sampling rate of the A/D converter, the effective filtering properties of the system can be easily varied. The sampling rate generator 22 may take the form of a programmable divider which receives a control signal from the control section 20. The control signal from control section 20 changes the dividing characteristics of the programmable divider so as to provide different frequency sampling clocks at the output thereof, which sampling clock signals are fed to the A/D converter 2 and the A/D counter 38.

Typical control sections are generally illustrated in Reference 20 and can easily be implemented in the present system using the design criteria disclosed therein.

Figure 7:
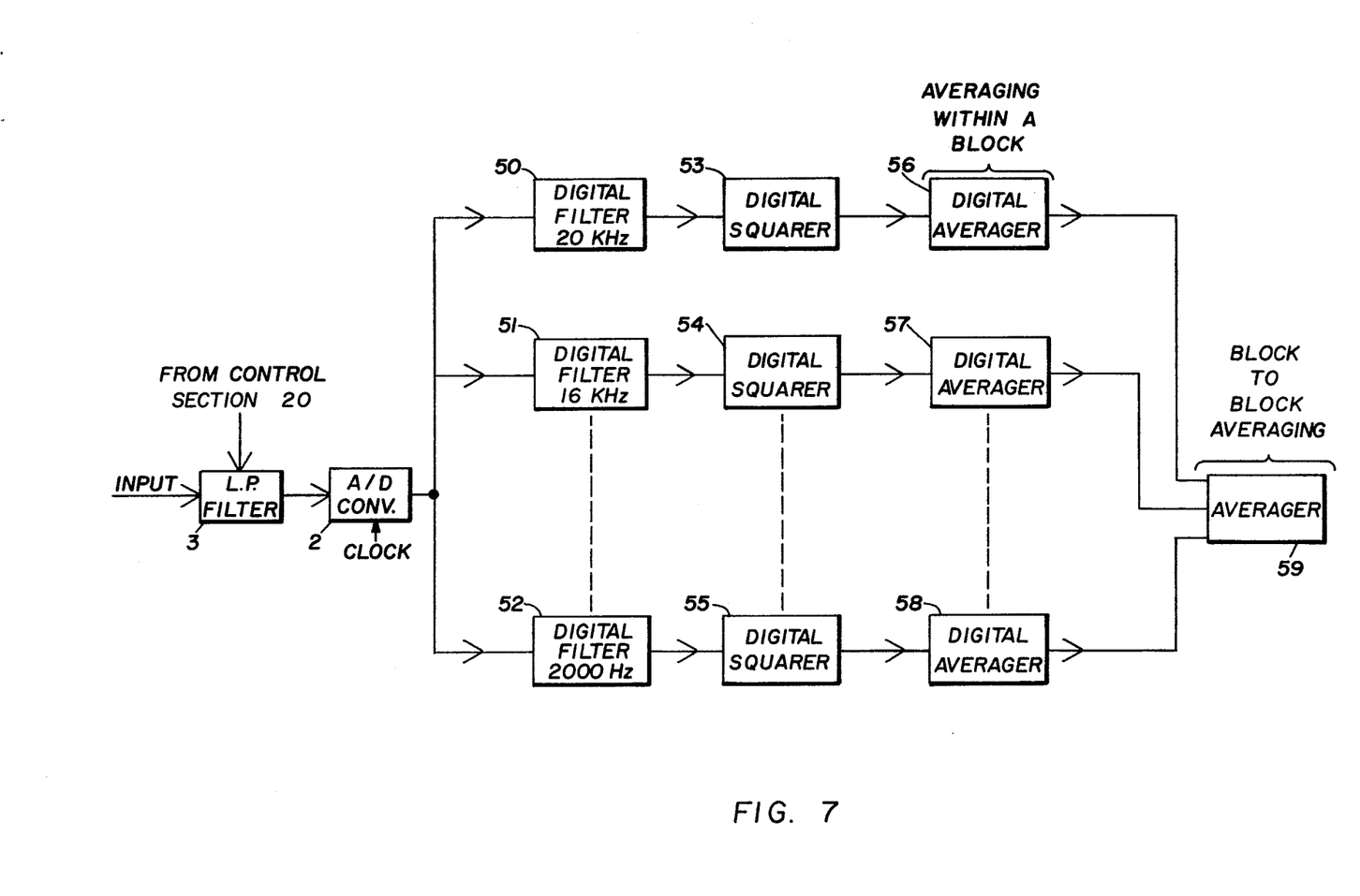
FIG. 7 is a block diagram of an equivalent circuit of the embodiment of FIG. 6 from a functional point of view.

FIG. 7 is a block diagram of an equivalent circuit for the circuit shown in FIG. 6. FIGS. 8a–8d show output characteristic signals of the equivalent circuit of FIG. 7.

Figures 8A, 8B:
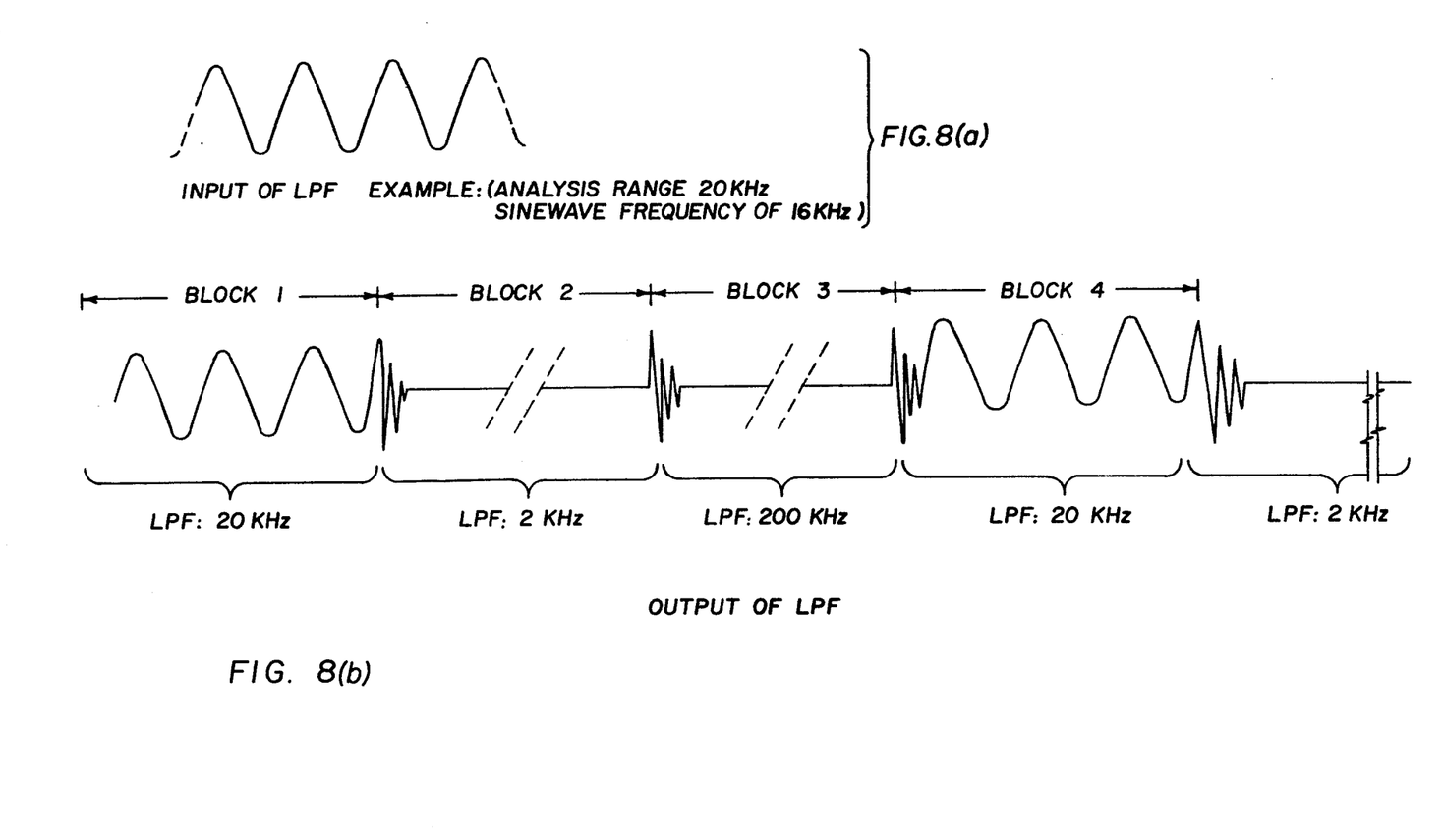
FIGS. 8a–8d illustrate typical signal outputs at various points in the equivalent block circuit diagram of FIG. 7.

Assume, for example, that the input signal to the system is 16 KHz and that the front panel is set to provide an analysis range up to 20 KHz. Assume further that the input is a substantially pure sine wave signal. Upon setting of the front panel switch to the 20 KHz range, the digital filter 50 is set to 20 KHz, the digital filter 51 is set to 16 KHz and a subsequent digital filter 52 is set to about 2000 Hz. As shown in FIG. 8b, the output of the analog low pass filter 3 is a 16 KHz signal. After a first period of time, the analog filter 3 is switched to become a 2 KHz filter and the output is shown as indicated in the second block in FIG. 8b. After a next given period of time, the analog filter 3 is switched to have a pass band of 200 Hz and the output is as shown in block 3 of FIG. 8b. Then, the sequence is repeated as indicated in FIG. 8b. The switching of the filter to different bands is accomplished by means of the control section and is accomplished by remote programming as should be apparent from the circuit arrangement of FIG. 6. Transients which occur during filter switching have a well determined duration which is dependent on low pass filter 3 bandwidth and are ignored during processing. The broken lines in FIG. 8b indicated that the filter remains at 2 KHz 10 times longer than at 20 KHz, and at 200 Hz 10 times longer than at 2 KHz.

Figure 8C:
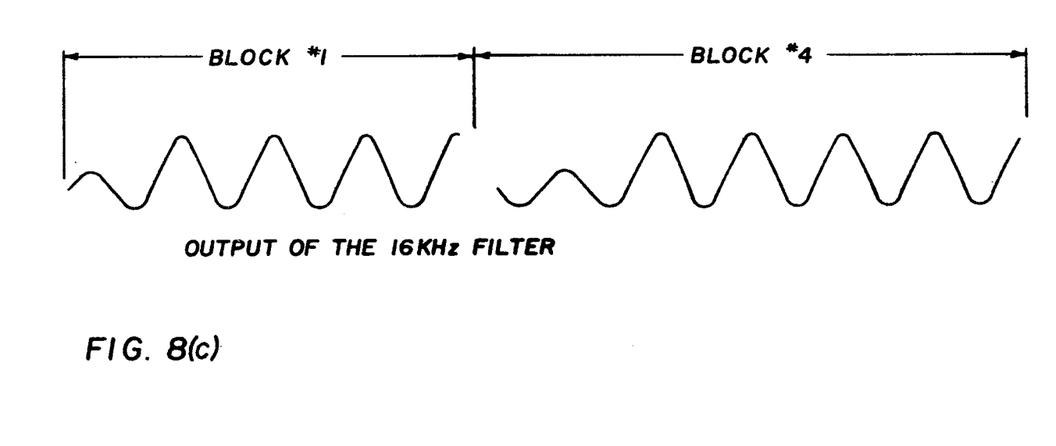

FIG. 8c illustrates the output of the 16 KHz filter. As seen from FIG. 8c, outputs are obtained only in blocks 1 and 4, blocks 2 and 3 having no output similar to the illustration of blocks 2 and 3 in FIG. 8b. The outputs for the remaining equivalent filters in FIG. 7 are substantially zero during all time periods since the 16 KHz input signal is outside their band.

The outputs from the various digital filters 50–52 are squared by respective digital squarer circuits 53–55, the outputs of which are coupled to respective digital averaging circuits 56–58. The outputs of the averaging circuits 56–58 are coupled to an averager 59 which averages the signal on a block-to-block basis.

In the above discussion of FIG. 7, it should be clear that more than three digital filters 50–52 may be provided. Only three are shown for the sake of ease of description. Also, it should be clear that the filters are switched from one bandpass range to another automatically by means of output signals from the control section 20, and that the low pass filter 3 and A/D converter 2 are likewise controlled automatically by the control section 20. As mentioned above, the bandpass characteristics of a digital filter may be varied merely by changing the A/D converter sampling rate so that the digital filter "sees" different sampling rates, thereby changing their effective bandwidths.

Figure 8D:
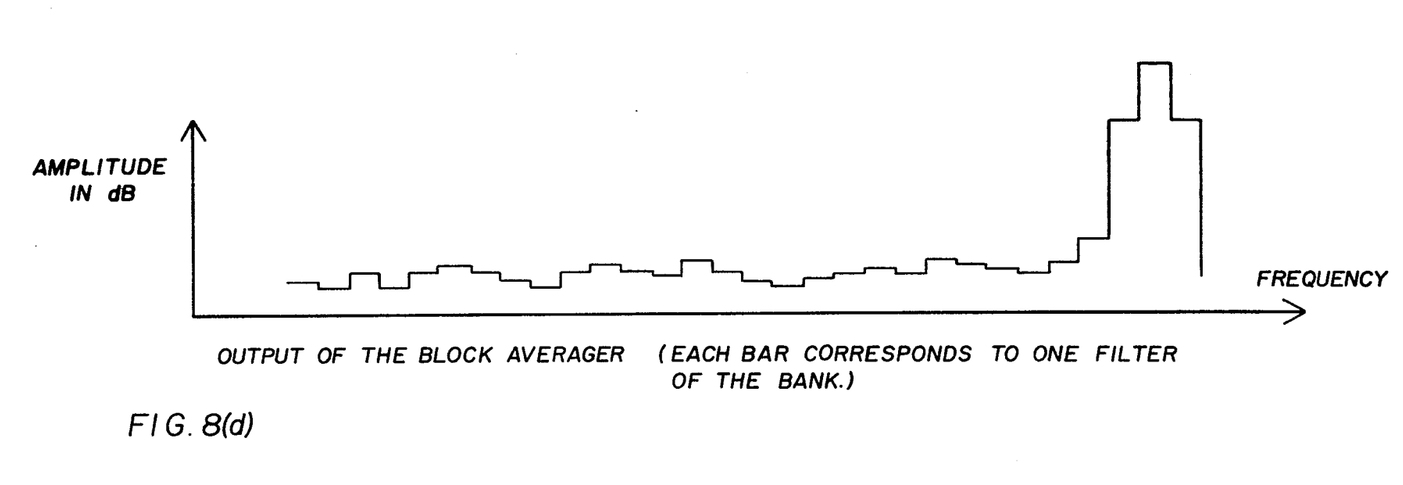

FIG. 8d illustrates the output of the block averaging circuit. Each bar in FIG. 8d corresponds to one filter of a typical bank of filters. As shown in FIG. 8d, the output at 16 KHz is maximum. The outputs at about 12 and 20 KHz are also substantial outputs, and appear due to overlapping characteristics of the filters. See FIG. 1 wherein it is clearly seen that the skirts of the filters gently slope and are not exactly vertical.

The output illustrated in FIG. 8d is the output which would be obtained from the block diagrams illustrated in FIGS. 4 and 6, and from the equivalent block diagram of FIG. 7.

The circuit arrangement of the present invention has been shown in block diagram form so as to clearly illustrate the inventive concept without unduly obscuring the invention. However, the Data Collection Logic 39 and sample rate generator 22 of FIG. 6 will be described in greater detail below with reference to FIGS. 9 and 10, respectively.

Figure 9:
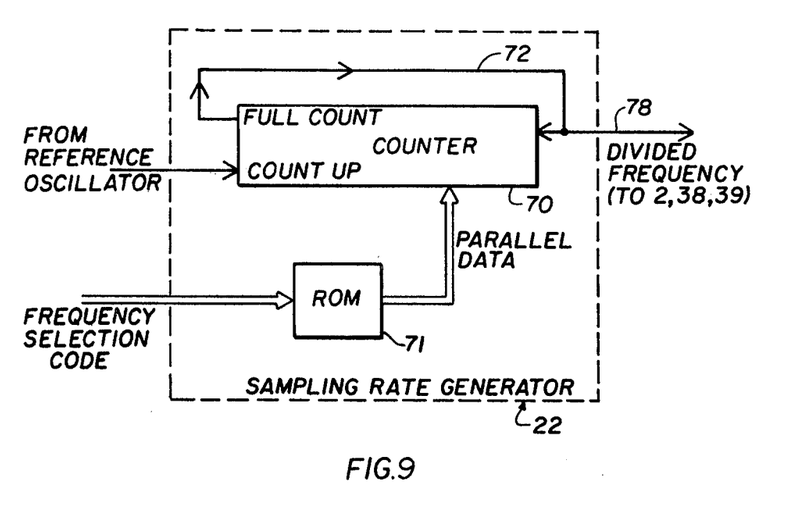
FIG. 9 is a block diagram of a sample rate generator generally shown in FIG. 6.

Referring to FIG. 9, the sample rate generator 22 comprises a counter 70 which receives the reference oscillator signal as its input. The frequency selection code signal is coupled to an ROM 71 which provides parallel data to the counter 70 to vary the counting cycle of the counter 70. The counter 70 has a feedback-type reset line 72, the effective position of which in the counting cycle is varied by the outputs from the ROM 71. This effectively varies the counting cycle of the counter 70 and provides the desired divided frequency at the output 73 of the sample rate generator. The output 73 of the sample rate generator is coupled to the A/D converter 2, A/D counter 38 and the data collection logic 39.

Figure 10:
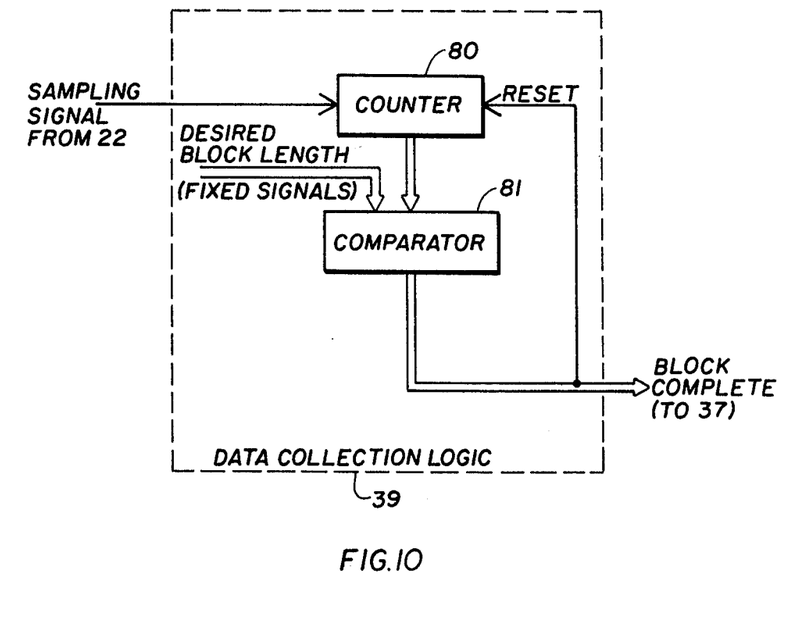
FIG. 10 is a block diagram of the data collection logic generally shown in FIG. 6.

The data collection logic 39 is illustrated in greater detail in FIG. 10, and comprises a counter 80 receiving as its input the output from the sample rate generator 22. The parallel outputs of the counter 80 are supplied to a comparator 81, the other input of the comparator 81 being a fixed set of signals which represent a desired block length of data. When the desired block length signals correspond to the outputs from the counter 80, the comparator 81 issues an output which indicates that the block is complete, and also resets the counter 80. The "block complete" output of the data collection logic is coupled to the system status flags and counters 37 of the control section 20.

The specific designs of the various other elements illustrated in the drawings should be apparent to those skilled in the art to which the present invention pertains.

In addition to the advantages of the arrangement of the present invention as discussed above, there are other advantages to using digital filters as shown in the illustrated embodiments of the invention. These additional advantages derive from the well-known fact that the frequency axis for the filter's transmission characteristic is proportional to the sampling rate used in the A/D converter. Doubling the rate, for example, will translate the center frequency by a factor of two as well as double its bandwidth. The skirt selectivity relative to the center frequency will also be identical. As a result, the same filters can be repositioned to cover another range. For example, if the three analysis ranges selected are 0–100,000 Hz, 0–10,000 Hz and 0–1,000 Hz, then spectrum analysis for 30 third-octave filters from 125 Hz to 100,000 Hz will be performed.

This same property may be used to remove the effects of flutter and wow. As an example, consider a tape recorder whose speed is not constant. As the recorder speed changes, the frequency of the sound appears to change in the same way. A 10% increase in speed appears to cause a recorded sine wave to increase 10%. The digital filters can be made to follow this change by simply deriving a reference signal that indicates the speed change and using it as the reference input to the sampling frequency clock (FIG. 4). The reference signal may be a recorded frequency tone or for rotating devices it can be a signal indicating its rpm.

While the invention has been described above with respect to specific apparatus and applications, it should be clear that modifications may be made within the spirit and scope of the present invention as defined in the appended claims.

We claim:

1. Spectrum analyzer comprising:
   (a) a source of an input signal to be spectrum analyzed, said input signal comprising a plurality of digital input information data blocks, each data block being of a given time duration and each comprising a predetermined number of digital words, each data block representing signal energy with a different frequency range;
   (b) means coupled to said source for weighting respective ones of said digital words as a function of a weighting function having a "smooth" function at its end points corresponding to the end points of said data blocks;
   (c) means for digitally filtering each of the weighted digital data blocks with a digital filtering means having at least one center frequency falling within the frequency range represented by each of said data blocks, each of the data blocks comprising N samples satisfying the following equation:

$$N > K f_o / B_n$$

where $K$ is a constant which is a function of the sampling rate and the falloff rate of the skirt of filter characteristics, $B_n$ is the filter bandwidth and $f_o$ is the center frequency of the filter; and
   (d) means for effectively changing the bandpass frequencies of said digital filter means during spectrum analysis of said digital information data blocks of said input signal.

2. Spectrum analyzer according to claim 1 wherein said digital filtering means comprises means defining a plurality of digital bandpass filters having respective center frequencies which decrease relative to one another, said digital filters filtering within a first range corresponding to a frequency range represented by a first data block and having changeable center frequencies to filter within at least a second range for successive data blocks of different frequency range.

3. Spectrum analyzer according to claim 2 wherein said digital filtering means comprises means defining at least ten of said digital bandpass filters.

4. Spectrum analyzer according to claim 1 wherein said digital filtering means comprises means defining a plurality of digital bandpass filters; digital squaring devices coupled to respective digital filters; digital averaging devices coupled to respective digital squaring devices and an overall averaging device coupled to the outputs of said individual digital averaging devices, said individual digital averaging devices providing averaging within a data block and said overall averaging device providing block-to-block averaging.

5. Spectrum analyzer according to claim 1 wherein said weighting function is a Hanning function.

6. Spectrum analyzer according to claim 1 wherein said weighting means comprises means for multiplying the digital words of each respective data block with respective weighting values corresponding to said weighting function.

7. Spectrum analyzer according to claim 6 wherein said weighting function is a Hanning function.

8. Spectrum analyzer according to claim 1 wherein said means for effectively changing the bandpass frequencies during spectrum analysis is coupled to said input signal source.

9. Spectrum analyzer according to claim 1 wherein said digital filtering means comprises a plurality of proportional bandwidth digital filters, each having a constant ratio of filter bandwidth to center frequency.

10. Spectrum analyzer comprising:
    (a) a source of a plurality of digital input information data blocks, each data block being of a given time duration and each comprising a predetermined number of digital words, each data block representing signal energy within a different frequency range;
    (b) means coupled to said source for weighting respective ones of said digital words as a function of a weighting function having a "smooth" function at its end points corresponding to the end points of said data blocks; and (c) means for digitally filtering each of the weighted digital data blocks with digital filtering means having at least one center frequency falling within the frequency range represented by each of said data blocks, each of the data blocks comprising N samples satisfying the following equation:

$$N > K f_o / B_o$$

where $K$ is a constant which is a function of the sampling rate and the falloff rate of the skirt of filter characteristics, $B_n$ is the filter bandwidth and $f_o$ is the center frequency of the filter;

said source including:
a source of an analog input;
an analog low pass filter with a controlled low pass cutoff;
an A/D converter operative at a controlled sampling rate;
control means for setting, during spectrum analysis, the sampling rate to a selected one of a plurality of rates for each data block, each sampling rate corresponding to a given frequency range, and for controlling, during spectrum analysis, the low pass cutoff of the low pass filter to a frequency which is a function of the selected sampling rate, thereby effectively changing the bandpass frequencies of said digital filtering means during spectrum analysis;
means for counting the number of samples obtained at each sampling rate and for defining a data block; and
means coupling the data block defined by said counting means to said weighting means.

11. Spectrum analyzer according to claim 10 comprising a sampling rate generator having a controlled frequency coupled to said A/D converter for varying the sampling rate of said A/D converter.

12. Spectrum analyzer according to claim 11 wherein said counting means comprises a counter coupled to the output of said sampling rate generator.

13. Spectrum analyzer according to claim 10 wherein said digital filtering means comprises means defining at least ten of said digital bandpass filters.

14. Spectrum analyzer according to claim 10 wherein said digital filtering means comprises means defining a plurality of digital bandpass filters; digital squaring devices coupled to respective digital filters; digital averaging devices coupled to respective digital squaring devices and an overall averaging device coupled to the outputs of said individual digital averaging devices, said individual digital averaging devices providing averaging within a data block and said overall averaging device providing block-to-block averaging.

15. Spectrum analyzer according to claim 10 wherein said weighting function is a Hanning function.

16. Spectrum analyzer according to claim 10 wherein said weighting means comprises means for multiplying the digital words of each respective data block with respective weighting values corresponding to said weighting function.

17. Spectrum analyzer according to claim 16 wherein said weighting function is a Hanning function.

18. Spectrum analyzer according to claim 10 wherein said digital filtering means comprises a plurality of proportional bandwidth digital filters, each having a constant ratio of filter bandwidth to center frequency.

* * * * *